(12) United States Patent
Ponse

(10) Patent No.: US 6,424,006 B1
(45) Date of Patent: Jul. 23, 2002

(54) SEMICONDUCTOR COMPONENT

(75) Inventor: Frederik Ponse, Unterhaching (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 08/666,970

(22) Filed: Jun. 20, 1996

(30) Foreign Application Priority Data

Jun. 20, 1995 (DE) .......................................... 195 22 364

(51) Int. Cl.⁷ .............................................. H01L 29/76
(52) U.S. Cl. ....................... 257/341; 257/343; 257/401; 257/563
(58) Field of Search ................................ 257/341, 343, 257/401, 560, 563, 342

(56) References Cited

U.S. PATENT DOCUMENTS 4,161,740 A * 7/1979 Frey .............................. 357/36
4,908,680 A   3/1990 Matsuoka

FOREIGN PATENT DOCUMENTS

EP   000494625  * 7/1992  .................. 257/401
JP   362296475  * 12/1987 .................. 257/401

OTHER PUBLICATIONS

Patent Abstracts of Japan No. 07029919 (Ryoji), dated Jan. 31, 1995.
Patent Abstracts of Japan No. 04125941 (Hiroshi, dated Apr. 27, 1992.
"Air Bridge Fet Devices for High–Performance Microwave Circuits" (Bastida et al.), 15ᵗʰ European Microwave Conference, Sep. 1985, pp. 239–244.
NE 9004 Series, Electrical Characteristics, Chip Dimensions and Handling, Chapter 2–22.
JS 8855–AS (Toshiba), Chip Outline, p. 3.
CFX 91 Series (Philips), Power Fet.
FLR 056 XV (Fujitsu), S–Parameters.

* cited by examiner

Primary Examiner—Sara Crane
(74) Attorney, Agent, or Firm—Laurence A. Greenberg; Werner H. Stemer; Ralph E. Locher

(57) ABSTRACT

A semiconductor component, such as a high-frequency integrated circuit, includes a semiconductor substrate with one or more transistors formed thereon. First, second and third electrode terminals are respectively associated with the gate or base terminal, the source or emitter terminal, and with the drain or collector terminal of the transistors. Each electrode terminal is formed with one or more finger sections and one contact area section electrically connected to the associated finger section. The area of the contact section is considerably enlarged as compared with the area of the individual finger section of the electrode terminal. At least one electrode terminal, whose contact area section is disposed on one side of the finger sections, has a further contact area section electrically connected to the associated finger section. The further contact area section is disposed on the opposite side relative to the finger sections. The connection to the finger sections associated with the one terminal extends above a supply line leading to the gate or base terminal, thereby forming an insulating crossing point. On the opposite side with respect to the finger sections, also forming insulating crossing points, it is carried in the form of bars below the supply lines belonging to the third electrode terminal.

17 Claims, 2 Drawing Sheets

SEMICONDUCTOR COMPONENT

BACKGROUND OF THE INVENTION

1. Field of the Invention

The invention relates to a semiconductor component having a semiconductor substrate and at least one transistor embodied on the semiconductor substrate with first, second and third electrode terminal connection regions, formed on a main surface of the semiconductor substrate and electrically insulated from one another, one of which is associated with the gate terminal or base terminal, one is associated with the source terminal or emitter terminal, and one is associated with the drain terminal or collector terminal of the at least one transistor, each electrode terminal connection region being formed of at least one finger section and one contact area section electrically conductively connected to the associated finger section. In particular, the at least one finger section has a longitudinal extent that is considerably larger than the extent widthwise, the area of the contact area section is enlarged considerably over the area of each individual finger section of the electrode terminal connection region, and the finger sections of the electrode terminal connection regions are arranged on the semiconductor substrate, aligned at least approximately parallel to one another.

In previously known GaAs field effect transistors with multi-finger configuration, and in particular those for high-frequency applications, a row of drain bond pads is typically provided on one side of the actual active FET region, and a row of gate bond pads and a row of source via holes (metallized holes through the semi-insulating substrate for through-plating to the back side) are provided in alternation on the other side. Such a configuration is described for instance in the data sheets NE 9004 (NEC) JS8855-AS (Toshiba), CFX 91 (Philips), and FLR056XV (Fujitsu), and are described in further detail below in conjunction with the schematic plan view shown in FIG. 1 of the drawing. The purpose of such a configuration is to obtain the smallest possible inductance in the connection with the external circuit, particularly with a view to the negative-feedback source inductance, which otherwise negatively affects the high-frequency performance.

SUMMARY OF THE INVENTION

It is accordingly an object of the invention to provide a semiconductor component, which overcomes the above-mentioned disadvantages of the heretofore-known devices and methods of this general type and which, while requiring slightly more space, enables increased electrical conductivity and current-carrying capacity, particularly of the finger sections, and at the same time a decrease in the effective heat resistance and a pronounced increase in the parasitic source inductance or emitter inductance.

With the foregoing and other objects in view there is provided, in accordance with the invention, a semiconductor component, comprising:

- a semiconductor substrate having a main surface;
- at least one transistor formed on the semiconductor substrate with a gate or base terminal, with a source or emitter terminal, and with a drain or collector terminal;
- first, second and third electrode terminals formed on the main surface of the semiconductor substrate and electrically insulated from one another, the electrode terminals being respectively associated with the gate or base terminal, with the source or emitter terminal, and with the drain or collector terminal of the at least one transistor;
- each of the electrode terminals being formed with at least one finger section and a first contact area section electrically connected to a respective the finger section and being disposed laterally thereof; and
- at least one of the electrode terminals having a second contact area section electrically connected to the respective the finger section and being disposed laterally opposite the first contact area section across the finger section.

In other words, the semiconductor component according to the invention is distinguished in that at least one electrode terminal connection region, whose contact area section is disposed on one side of the finger sections, has a further contact area section electrically connected to the associated finger section. The further contact area section is disposed on the opposite side of the finger sections. The further contact area sections advantageously have an area that is enlarged compared with each individual finger section.

The configuration according to the invention offers the advantage, particularly if there is a sufficiently small spacing of the contact area sections from the active region of the transistor and a suitably thick metallizing of the electrode terminal connection regions, and above all of the vias, of enabling a considerable reduction in the effective heat resistance. Accordingly, the heat produced because of the electrical power loss, especially in the active region of the transistor, can be better dissipated. In this respect it should be noted that metals generally have a heat conductivity that is far better, by more than one order of magnitude, than the usual semiconductor materials (Si or GaAs) so that even thin metal films can enable a substantial decrease in the thermal resistance.

In accordance with an added feature of the invention, at least one electrode terminal connection region, whose contact area section is disposed on the one side of the finger sections, has a further finger section that is electrically connected to this contact area section and/or to the associated further contact area section. The further finger section can open into a widening portion electrically connected to it, which portion is disposed on the opposite side with respect to the finger sections and has a width that is at least somewhat increased compared with the other finger section. It may advantageously be provided that the further finger section is electrically connected via a bar to the finger section and/or the further contact area section on the opposite side of the finger sections of the associated electrode terminal connection region. Moreover, it may be provided in detail that the finger section of a contact area section located on the opposite side of the finger sections and closest to the bar, of an adjacent electrode terminal connection region is embodied so as to cross over the bar in an electrically insulating way, forming a crossing point.

In accordance with an additional feature of the invention, the electrode terminal connection region associated with the gate terminal or base terminal of the transistor has many finger sections, which are connected electrically conductively to the associated contact area section of the electrode terminal connection region associated with the gate terminal or base terminal of the transistor, and which extends parallel between the finger sections of the electrode terminal connection regions associated with the source terminal or emitter terminal and the drain terminal or collector terminal of the transistor.

In accordance with again an additional feature of the invention, the many finger sections of the electrode terminal connection region associated with the gate or base terminal of the transistor are connected via a supply line to the associated contact area section of the gate terminal or base terminal. It is advantageous if the finger section of the contact area section, disposed on one side of the finger sections, of an electrode terminal connection region is embodied so that it electrically insulatingly crosses over the supply line associated with the gate terminal or base terminal of the transistor, forming a crossing point.

In accordance with a further feature of the invention, the crossing points may be embodied as a metal/insulator layer/metal crossing (MIM crossing) or as an air bridge.

In accordance with again a further feature of the invention, the one group of contact area sections of the electrode terminal connection regions that is associated with the source terminal or emitter terminal of the transistors and the contact area section of the electrode terminal connection regions that is associated with the gate terminal or base terminal of the transistors are aligned in alternation and in one row on one side with respect to the finger sections, and the further contact area sections of the electrode terminal connection regions associated with the source terminal or emitter terminal of the transistors, end the contact area sections of the electrode terminal connection regions associated with the drain terminal or collector terminal of the transistors, are aligned in one row alternatingly on the opposite side of the finger sections.

In an especially preferred embodiment of the semiconductor component according to the invention, the connection to those finger sections that are associated with the source or emitter terminal connection region is carried over the supply line leading to the gate terminal or base terminal, forming an insulating crossing point, and at the same time on the opposite side with respect to the finger sections, forming likewise insulating crossing points, is carried in the form of bars under the supply lines belonging to the third electrode terminal connection region (which is associated with the drain or collector terminal of the transistor).

The terminal or crossing configuration of the semiconductor component of the invention makes substantially more-effective heat dissipation possible, which would otherwise require the use of maximum metallizing thicknesses for the supply leads. Following the principle of the invention, to connect the inner FET cells (which form the actual active FET region) to the external surroundings, in this case the contact area sections, advantageously two types of line crossings are used: On the side of the gate terminal or base terminal (that is, on the one side of the finger sections), a connecting metal plane, as the source terminal or emitter terminal, crosses the gate or base supply lead; on the drain terminal or collector terminal side (that is, on the opposite side with respect to the finger sections), this same connecting metal plane for example this type, acting as a drain terminal or collector terminal, crosses the source or emitter supply lead, which here might, in the crossing region, for instance comprise merely ohmic metal. Moreover, the crossing metals below may be reinforced with an additional connecting metal plane, should that appear useful for reasons of resistance or electron migration.

In accordance with yet a further feature of the invention, the one group of contact area sections and/or the further contact area sections of the electrode terminal connection region associated with the source terminal or emitter terminal of the at least one transistor have a substrate through-plating. In this way, the inductance to the back side can advantageously be minimized in the through-plating, especially of high-impedance substrates. The ground inductance can in particular be further minimized on both sides of the finger sections in an embodiment with two rows of substrate through-plating (rows of via-holes); the area required is only slightly greater than in the conventional configuration with only one row of via-holes on only one side of the finger sections. If these via-holes are disposed close enough to the active region (spacing on the order of magnitude of the substrate thickness or less), then the thermal resistance to the heat sink (back side of the semiconductor substrate) is markedly reduced, especially in the case of an configuration on both sides of the finger sections or the center line of the contact area sections associated with the source terminal or emitter terminal of the transistor.

Both effects, in this embodiment of the semiconductor component according to the invention, that is, the minimization of inductance to the back side in the case of the via-holes and the reduction in the heat resistance, can be attained together but can also be employed independently of one another; for instance, better heat dissipation is more important particular in power applications, while minimized source inductance plays a greater role in low-noise components, for instance.

Extending the terminals to the outer contact area sections or pads as provided by the invention thus makes it possible, especially in the inner FET cells as well, to line both the source or emitter faces and the drain or collector faces fully with the connecting metal plane or planes, so that on all the fingers the electrical conductivity and current-carrying capacity are increased, and electron migration problems in the final analysis are at least reduced.

The semiconductor component of the invention is used in FETs, bipolar transistors and similar components, and especially for high-frequency applications and monolithically integrated circuits that contain such components. In terms of the names used for them, the components associated with the source or emitter portion may be transposed with the components assigned to the drain or collector portion or to the gate terminal or base terminal; for instance, the outer contact area sections or pads in the corresponding pad rows may also comprise gate portions or drain portions instead of source portions. Instead of the source vias, source pads can also be used; naturally, the aspect of thermal resistance does not exist for the via. Nevertheless, once again there are thermal advantages because of the larger metallized surface area and along with this better heat distribution on the surface of the semiconductor substrate.

The advantages according to the invention apply both for a basic chip (with only one drain and gate pad or terminal each), for many-finger structures ("arbitrarily" many gate and drain pads), and for MMICs with corresponding FET cells and other comparable semiconductor components.

Other features which are considered as characteristic for the invention are set forth in the appended claims.

Although the invention is illustrated and described herein as embodied in a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
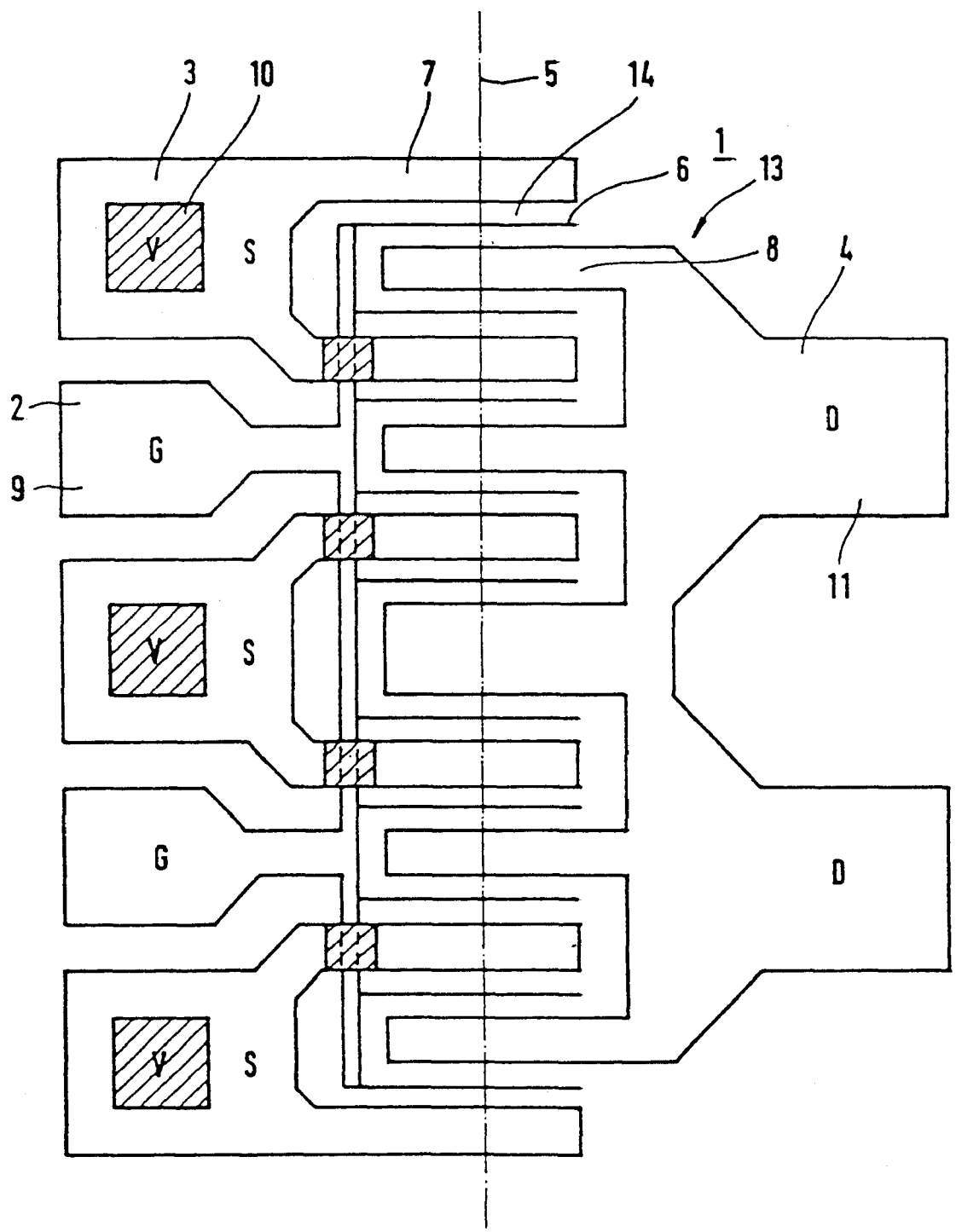
FIG. 1 is a schematic plan view onto a conventional GaAs FET with a multi-finger array.

It should be noted that chips in the prior art have above all been thin for the sake of effective heat dissipation. Referring now to the figures of the drawing in detail, the schematic plan view of FIG. 1 shows a conventional semiconductor component with a semiconductor substrate 1 of GaAs and a row of transistors, embodied on the semiconductor substrate. One electrode terminal connection region 2 is associated with the gate terminal or base terminal, one electrode terminal connection region 3 is associated with the source terminal or emitter terminal, and one electrode terminal connection region is associated with the drain terminal or collector terminal. Each terminal region 2, 3 and 4 comprises finger sections 6, 7 and 8 extending side by side, oriented parallel to one another and in the direction of one of the finger sections 5, and contact area sections 9, 11 and via contact faces 10 whose area is enlarged relative to the finger sections 7, 6 and 8. In the prior art configuration, the contact area sections 9 and 10 for the gate terminals and the source terminals are disposed alternating in one row on one side of the finger sections 5, while the contact area sections 4 of the drain terminals are oriented on the opposite side of the finger sections 5. These force contact faces can, instead of being embodied as source via holes, also be embodied as normal contact faces on the surface of the semiconductor substrate.

Figure 2:
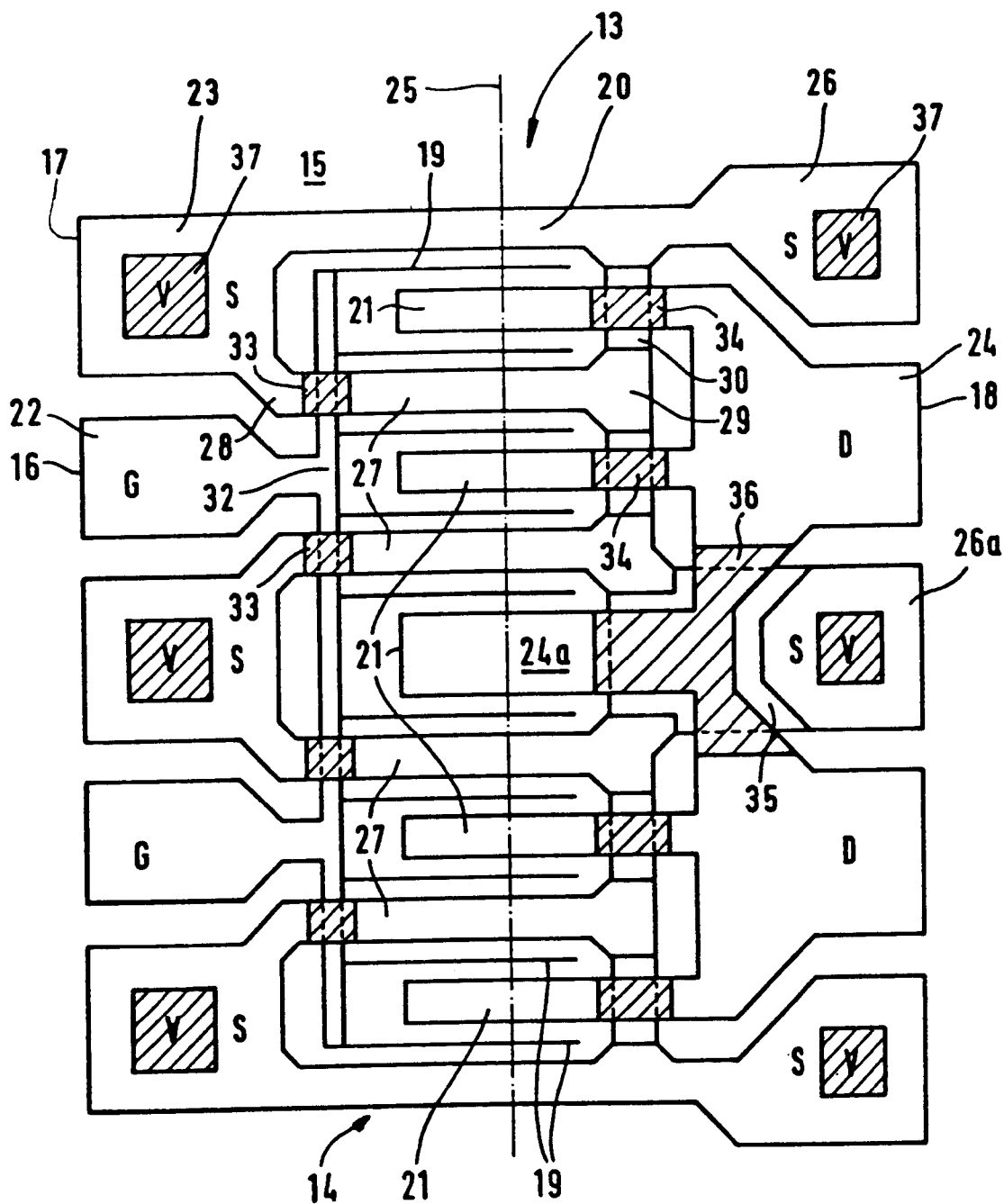
FIG. 2 is a schematic plan view onto a semiconductor component according to the invention, with rows of via-holes on both sides and with a special connection topology.

Referring now particularly to FIG. 2, there is shown an exemplary embodiment of a semiconductor component 13 according to the invention. A GaAs FET with a multi-finger array 14 is embodied on a GaAs semiconductor substrate 15. The transistor has a first electrode terminal connection region 16, associated with the gate G of the transistor; a second electrode terminal connection region 17, associated with the source terminals of the transistor; and a third electrode terminal connection region 18, associated with the drain terminal D of the transistor, these electrode terminal connection regions 16, 17, 18 (also referred to as terminals) having the connection topology shown in FIG. 2. The connection topology of FIG. 2 is shown approximately to scale for the outer terminals 16, 17, 18, with 1 cm in the drawing corresponding to approximately 50 µm in reality; the connection topology shown, with all the geometrical details and other characteristics in drawing terms are considered in their entirety to be part of the disclosure content of the present application. Each electrode terminal connection region 16, 17, 18 comprises finger sections 19, 20, 21 with a considerably greater longitudinal extent, and a contact area section 22, 23, 24, electrically conductively connected to the associated finger section 19, 20, 21 and having an area that in each case is considerably increased over the area of the individual ones of the finger sections 19, 20, 21. The finger sections 19, 20, 21 of all the electrode terminal connection regions 16, 17, 18 are oriented parallel to one another and in the direction of a center line 25 (which serves to designate the configuration on the left and right sides of it with respect to the finger sections, and does not necessarily indicate a line of symmetry), side by side on the semiconductor substrate 15. These finger sections are not shown to scale. In particular, considerably more single fingers 19, 20, 21 can be associated with the individual ones of the outer electrode terminal connection regions 16, 17, 18. The electrode terminal connection region 17 associated with the source terminal has, in addition to the contact area section 23 disposed on one side of the center line 25, a further contact area section 26, disposed on the opposite side of the center line 25, or in the view of FIG. 2 on the right, which likewise has an area increased over the individual finger section 20, as shown. The electrode terminal connection region 17 associated with the source terminal also has a further finger section 27, which beginning at the one contact area section 23 extends along a kink point 28 parallel to the other finger sections 19, 20, 21 and opens into a portion 29 connected to them that is disposed on the opposite side of the center line 25. The portion 29 is joined to the finger section 20 via a bar 30. The electrode terminal connection region 16 associated with the gate terminal of the transistor has a supply line 32, extending parallel to the center line 25 and disposed on the left-hand side, in view of FIG. 2, which effects the electrical connection between the individual finger sections 19 and the contact area section 22.

As shown, the further finger sections 27 of the electrode terminal connection region 17 associated with the source terminal are extended over a bridge 33 over the supply line 32; this bridge 33 forms a crossing point that electrically insulates the finger section 27 from the supply line 32 and that may be embodied as a metal-insulator layer-metal crossing (metal/insulator/metal crossing) or as an air bridge. Analogously, the finger sections 21, which extend, in terms of the view of FIG. 2, leftward from the contact area sections 24 of the electrode terminal connection region 18 located on the right-hand side, are extended by way of a bridge 34 over the bar 30 of the electrode terminal connection region 17; this bridge 34 forms a crossing point for electrical insulation of the finger section 21 from the bar 30 and can again be embodied as a metal/insulator layer/metal crossing or as an air bridge. The two contact area sections 27 of the electrode terminal connection region 17, as can be seen from FIG. 2, are electrically connected, via a connecting portion 35, with one another, and with the further contact area section 26a of the electrode terminal connection region 17 disposed on the right-hand side in terms of FIG. 2, between the contact area sections 24 of the electrode terminal connection region 18. The intervening contact area section 24a of the electrode terminal connection region 18 can in turn be connected via a bridge 36, which leads over the connecting portion 35, to the finger section 21. When the semiconductor component is manufactured, the electrode terminal connection region 16 associated with the gate terminal G can be manufactured cohesively in a single method step with the embodiment of a first metallizing plane, and the electrode terminal connection regions 17 and 18 associated with the source terminal S and the drain terminal D can be manufactured in one operation in a method step of forming a second metallizing plane. In specialized methods, the planes can be achieved by means of the same metallization.

In the exemplary embodiment shown in FIG. 2, the contact area sections 22 and 24 of the electrode terminal connection regions 16 and 18 are embodied as so-called bond pads, while the contact area sections 23 associated with the source terminal S and/or the further contact area sections 26 are embodied as so-called via-hole contacts, that is, a metallized hole through the semi-insulating substrate for plating through to the back side of the substrate, as represented by the shaded regions 37 in FIG. 2. The advantage of rows of via-holes on both sides is especially that with only minimally increased spaced requirements, a substantial reduction in inductance to the backside of the substrate can be attained, and if the vias 37 are spaced closely enough from the active region and if the metallization in the via 37 is sufficiently thick, an effective reduction in heat resistance can be attained, so that the heat produced above all in the active region because of electrical power loss can be better dissipated.

I claim:
1. A semiconductor component, comprising:
a semiconductor substrate having a main surface;
at least one transistor formed on said semiconductor substrate with a gate or base terminal, with a source or emitter terminal, and with a drain or collector terminal;
first, second and third electrode terminals formed on said main surface of said semiconductor substrate and electrically insulated from one another, said electrode terminals being
respectively associated with said gate or base terminal, with said source or emitter terminal, and with said drain or collector terminal of said at least one transistor;
each of said electrode terminals being formed with at least one electrode terminal finger section defining a longitudinal direction, and a first contact are a section electrically connected to a respective finger section; and
at least one of said electrode terminals having a second contact area section electrically connected to said respective finger section and being disposed opposite said first contact area section in the longitudinal direction of said finger section.

2. The semiconductor component according to claim 1, wherein said at least one electrode terminal, includes a further finger section electrically connected to at least one of said first contact area section and a respectively associated second contact area section.

3. The semiconductor component according to claim 2, including a bar electrically connecting said further finger section with at least one of said first-mentioned finger section, and said second contact area section disposed opposite said finger sections of the associated electrode terminal.

4. The semiconductor component according to claim 3, wherein a finger section of a contact area section located on the opposite side and closest to said bar crosses over said bar electrically insulated therefrom, forming a crossing point.

5. The semiconductor component according to claim 4, wherein said crossing point is one of a metal/insulator/metal crossing or an air bridge.

6. The semiconductor component according to claim 1, wherein said electrode terminal associated with said gate or base terminal of said transistor has a multiplicity of finger sections electrically connected to said associated first contact area section, said multiplicity of finger sections extending mutually parallel between said finger sections of said electrode terminals associated with said source or emitter terminal and with said drain or collector terminal of said transistor.

7. The semiconductor component according to claim 6, including a supply line connecting said multiplicity of finger sections associated with said gate or base terminal of said transistor with said associated contact area section of said gate or base terminal.

8. The semiconductor component according to claim 7, wherein a finger section of said first contact area section crosses over said supply line in an electrically insulating manner, forming a crossing point.

9. The semiconductor component according to claim 8, wherein said crossing point is one of a metal/insulator/metal crossing or an air bridge.

10. A semiconductor component, comprising:
semiconductor substrate having a main surface;
at least one transistor formed on said semiconductor substrate with a gate or base terminal, with a source or emitter terminal, and with a drain or collector terminal;
first, second and third electrode terminals formed on said main surface of said semiconductor substrate and electrically insulated from one another, said electrode terminals being respectively associated with said gate or base terminal, with said source or emitter terminal, and with said drain or collector terminal of said at least one transistor;
each of said electrode terminals being formed with at least one electrode terminal finger section and a first contact area section electrically connected to a respective finger section and being disposed laterally thereof; and
at least one of said electrode terminals having a second contact area section electrically connected to said respective finger section and being disposed laterally opposite said first contact area section across said finger section,
wherein said at least one transistor is one of a plurality of transistors, and said first and second contact area sections (23, 26, 26a) of said transistors forming first and second groups of contact area sections, respectively; said first group of contact area sections associated with said source or emitter terminals of said transistors, and said contact area sections of said electrode terminals associated with said gate or base terminal of said transistors being aligned in alternation along a row on one side with respect to said finger sections; and said second group of contact area sections associated with said source or emitter terminals of said transistors, and said contact area sections of said electrode terminals associated with said drain or collector terminals of said transistors being aligned in alternation along a row on a side opposite the one side with respect to said finger sections.

11. A semiconductor component, comprising:
a semiconductor substrate having a main surface;
at least one transistor formed on said semiconductor substrate with a gate or base terminal, with a source or emitter terminal, and with a drain or collector terminal;
first, second and third electrode terminals formed on said main surface of said semiconductor substrate and electrically insulated from one another, said electrode terminals being respectively associated with said gate or base terminal, with said source or emitter terminal, and with said drain or collector terminal of said at least one transistor;
each of said electrode terminals being formed with at least one electrode terminal finger section, and a first contact area section electrically connected to a respective finger section and being disposed laterally thereof;
at least one of said electrode terminals having a second contact area section electrically connected to said respective finger section and being disposed laterally opposite said first contact area section across said finger section; and
at least one supply line connecting said multiplicity of finger sections associated with said gate or base terminal of said transistor with said associated contact area section of said gate or base terminal, and wherein a connection to said finger sections associated with said second electrode terminal extends across said supply line, forming an insulating crossing point, and, opposite therefrom with respect to said electrode terminal finger sections, extending (bars 30, 35) below said supply line to said third electrode terminal, likewise forming insulating crossing points.

12. The semiconductor component according to claim 1, wherein said first contact area section of said electrode terminal associated with said source or emitter terminal is formed with a substrate via hole.

13. The semiconductor component according to claim 1, wherein said second contact area section of said electrode terminal associated with said source or emitter terminal is formed with a substrate via hole.

14. The semiconductor component according to claim 1, wherein said first contact area section and said second contact area section of said electrode terminal associated with said source or emitter terminal are formed with a substrate via hole.

15. The semiconductor component according to claim 1, wherein said at least one transistor is a field effect transistor, and said semiconductor substrate comprises GaAs.

16. The semiconductor component according to claim 1, wherein said semiconductor component is a monolithically integrated high-frequency integrated circuit.

17. A semiconductor component, comprising:

a semiconductor substrate having a main surface;

at least one transistor formed on said semiconductor substrate with a gate or base terminal, with a source or emitter terminal, and with a drain or collector terminal;

first, second and third electrode terminals formed on said main surface of said semiconductor substrate and electrically insulated from one another, said electrode terminals being respectively associated with said gate or base terminal, with said source or emitter terminal, and with said drain or collector terminal of said at least one transistor;

each of said electrode terminals being formed with a first contact area section and at least one relatively long electrode terminal finger section electrically connected to said first contact area section; and at least one of said electrode terminals having a second contact area section electrically connected to said respective finger section and being disposed opposite from said first contact area section along a length of said finger section.

* * * * *